United States Patent
Sekine et al.

(10) Patent No.: US 9,950,925 B2
(45) Date of Patent: Apr. 24, 2018

(54) METHOD FOR FORMING FUNCTIONAL PART IN MINUTE SPACE

(71) Applicant: NAPRA CO., LTD., Tokyo (JP)

(72) Inventors: Shigenobu Sekine, Tokyo (JP); Yurina Sekine, Tokyo (JP)

(73) Assignee: NAPRA CO., LTD., Tokyo (JP)

( * ) Notice: Subject to any disclaimer, the term of this patent is extended or adjusted under 35 U.S.C. 154(b) by 0 days.

(21) Appl. No.: 15/643,417

(22) Filed: Jul. 6, 2017

(65) Prior Publication Data
US 2017/0305743 A1 Oct. 26, 2017

Related U.S. Application Data

(62) Division of application No. 13/678,900, filed on Nov. 16, 2012, now abandoned.

(30) Foreign Application Priority Data

Nov. 28, 2011 (JP) ................. 2011-259001

(51) Int. Cl.
| | |
|---|---|
| H01L 21/00 | (2006.01) |
| B82B 3/00 | (2006.01) |
| B22F 7/04 | (2006.01) |
| B29C 70/02 | (2006.01) |
| C03B 19/12 | (2006.01) |
| H05K 3/40 | (2006.01) |

(Continued)

(52) U.S. Cl.
CPC .......... *B82B 3/0038* (2013.01); *B22F 3/1021* (2013.01); *B22F 3/22* (2013.01); *B22F 7/04* (2013.01); *B29C 70/02* (2013.01); *B81C 99/0085* (2013.01); *C03B 19/12* (2013.01); *H01L 21/4867* (2013.01); *H01L 21/563* (2013.01); *H01L 21/76898* (2013.01); *H05K 3/4053* (2013.01); *H01L 2224/32145* (2013.01); *H01L 2924/1461* (2013.01); *H05K 2201/0215* (2013.01); *H05K 2201/0305* (2013.01); *H05K 2203/0425* (2013.01)

(58) Field of Classification Search
CPC .......... H01L 21/4867; H01L 21/76898; H05K 2203/0425
See application file for complete search history.

(56) References Cited

U.S. PATENT DOCUMENTS

| | | | | |
|---|---|---|---|---|
| 5,770,136 A | * | 6/1998 | Huang | ..... B22F 3/15 264/101 |
| 6,235,624 B1 | * | 5/2001 | Sasaki | ..... H01L 21/288 257/E21.174 |

(Continued)

FOREIGN PATENT DOCUMENTS

| | | | | |
|---|---|---|---|---|
| EP | 2596884 A1 | * | 5/2013 | .......... B82B 3/0038 |
| JP | 2013115177 A | * | 6/2013 | .......... B82B 3/0038 |

(Continued)

*Primary Examiner* — Laura Menz
(74) *Attorney, Agent, or Firm* — Westerman, Hattori, Daniels & Adrian, LLP

(57) ABSTRACT

A method for forming a functional part in a minute space includes the steps of: filling a minute space with a dispersion functional material in which a thermally-meltable functional powder is dispersed in a liquid dispersion medium; evaporating the liquid dispersion medium present in the minute space; and heating the functional powder and hardening it under pressure.

7 Claims, 3 Drawing Sheets

(51) Int. Cl.
*B22F 3/22* (2006.01)
*B22F 3/10* (2006.01)
*H01L 21/768* (2006.01)
*H01L 21/48* (2006.01)
*B81C 99/00* (2010.01)
*H01L 21/56* (2006.01)

(56) References Cited

U.S. PATENT DOCUMENTS

| | | | | |
|---|---|---|---|---|
| 7,425,507 | B2* | 9/2008 | Lake | H01L 21/30655 |
| | | | | 257/E21.259 |
| 8,415,784 | B2* | 4/2013 | Sekine | H01B 3/025 |
| | | | | 257/686 |
| 8,759,211 | B2* | 6/2014 | Sekine | H01B 3/025 |
| | | | | 438/627 |
| 9,807,871 | B2* | 10/2017 | Theis | H05K 1/0266 |
| 2005/0172483 | A1* | 8/2005 | Sugita | H01B 1/22 |
| | | | | 29/830 |
| 2006/0292877 | A1* | 12/2006 | Lake | H01L 21/30655 |
| | | | | 438/694 |
| 2010/0126688 | A1* | 5/2010 | Sekine | B22D 19/00 |
| | | | | 164/61 |
| 2010/0301485 | A1* | 12/2010 | Sekine | H01B 3/025 |
| | | | | 257/769 |
| 2011/0291276 | A1* | 12/2011 | Swaminathan | H01L 21/4857 |
| | | | | 257/741 |
| 2013/0136645 | A1* | 5/2013 | Sekine | B82B 3/0038 |
| | | | | 419/8 |
| 2015/0228382 | A1* | 8/2015 | Sekine | H01B 1/22 |
| | | | | 427/123 |
| 2016/0124407 | A1* | 5/2016 | Kallio | H04L 67/12 |
| | | | | 700/86 |
| 2017/0305743 | A1* | 10/2017 | Sekine | B82B 3/0038 |

FOREIGN PATENT DOCUMENTS

| | | | | |
|---|---|---|---|---|
| KR | 20130059281 A | * | 6/2013 | ........... B82B 3/0038 |
| WO | WO 2014191627 A9 | * | 12/2014 | ............. H04L 67/12 |

* cited by examiner

METHOD FOR FORMING FUNCTIONAL PART IN MINUTE SPACE

CROSS-REFERENCE TO RELATED APPLICATION

This application is a Divisional of copending U.S. patent application Ser. No. 13/678,900, filed on Nov. 16, 2012, which claims priority to Japanese Patent Application No. 2011-259001, filed on Nov. 28, 2011, the entirety of which is incorporated herein by reference.

BACKGROUND OF THE INVENTION

1. Field of the Invention

The present invention relates to a method for forming a functional part in a minute space.

2. Description of the Related Art

In electronic devices such as semiconductor devices, micromachines and so on, for example, there may be the case where a fine conductor-filled structure, an insulating structure or a functional structure each having a high aspect ratio must be formed therein. In such a case, there are known technologies for realizing a conductor-filled structure, an insulating structure, a functional structure, etc. by filling a previously chosen filler into a minute hole. However, it is extremely difficult to thoroughly fill a high-aspect-ratio minute hole with a filler down to the bottom thereof without forming a void or causing deformation after hardening.

As a related art capable of overcoming such a technical difficulty, there are known a filling method and device disclosed in Japanese Patent Nos. 4278007 and 4505540.

The technology disclosed in Japanese Patent No. 4278007 is a method for filling a molten metal in a fine hole present in a wafer and hardening it, the method having a step of cooling the molten metal and hardening it while applying a forced external force exceeding atmospheric pressure to the molten metal within the fine hole. The forced external force is given by at least one member selected among a pressing pressure, an injection pressure and a rolling compaction and applied to the molten metal from the opening surface side on which the fine hole is opened, in a state that the other end side of the fine hole is closed. Japanese Patent No. 4505540 discloses a device for implementing the method disclosed in Japanese Patent No. 4278007.

The above-described technologies disclosed in Japanese Patent Nos. 4278007 and 4505540 provide the following excellent effects: the fine hole can be filled with a filler without forming an air gap or void, the metal cooled and hardened within the minute space can be prevented from having a recessed surface, the process can be simplified and the yield can be improved, and so on.

SUMMARY OF THE INVENTION

It is an object of the present invention to provide a method for forming a functional part free from a void, gap or hollow in a minute space by using a low-temperature dispersion functional material.

To attain the above object, the present invention provides a plurality of methods belonging to a single inventive concept.

For forming a functional part in a minute space, first of all, a first method comprises the steps of:

filling a minute space with a dispersion functional material in which a thermally-meltable functional powder is dispersed in a liquid dispersion medium;

evaporating the liquid dispersion medium present in the minute space; and heating the functional powder and hardening it under pressure.

In the first method, as described above, used is a dispersion functional material in which a thermally-meltable functional powder is dispersed in a liquid dispersion medium. That is, the dispersion functional material is used as a fluid filler. Therefore, the functional powder, which is inherently difficult to use for filling because of its powder form, can be reliably filled into the minute space by using the fluidity of the dispersion functional material.

When filling the dispersion functional material into the minute space, it is preferably performed under a reduced-pressure atmosphere within a vacuum chamber. There may be adopted a differential pressure filling process, wherein the internal pressure of the vacuum chamber is increased after the pressure reduction. With this differential pressure filling process, the dispersion functional material can be reliably filled into the minute space. When filling the dispersion functional material into the minute space, for example, filling can be smoothly performed by applying ultrasonic vibration or the like to an object or a device.

Then, the liquid dispersion medium present in the minute space is evaporated. Thus, only the functional powder remains in the minute space. Thereafter, the remaining functional powder is melted by a heat treatment and then hardened under pressure. Thus, a functional part free from a void, gap or hollow can be formed in the minute space.

For example, the thermally-meltable functional powder may be, but not limited to, a low-melting metallic powder such as an Sn alloy.

As used herein, the term "functional material" refers to a material to be used for exhibiting properties of the material such as electrical properties, dielectric properties, magnetic properties, optical properties, etc. The term "functional powder" refers to a powder obtained by powdering such a functional material. The term "dispersion" refers to a suspension or paste in which fine solid particles are dispersed in a liquid dispersion medium, including both systems: a monodisperse system in which all the particles have a uniform particle size; a polydisperse system in which the particle size is not uniform. Moreover, it includes not only a coarse dispersion but also a colloidal dispersion.

On the other hand, a second method is characterized by using a dispersion functional material in which a functional powder and a binder powder are dispersed in a liquid dispersion medium. The same effect as described for the first method can also be obtained in the second method.

The functional powder and the binder powder may be, but not limited to, a combination of a high-melting metallic powder and a low-melting metallic powder.

Furthermore, a third method is characterized in that after the liquid dispersion medium present in the minute space is evaporated, a liquid binder is filled into a gap between particles of the functional powder present in the minute space, and then, after the liquid binder is reacted with the functional powder by a heat treatment, the functional powder and the liquid binder are hardened under pressure. The same effect as described for the first method can also be obtained in the third method.

In any of the first to third methods, the liquid dispersion medium may be an aqueous dispersion medium or a volatile organic dispersion medium.

As has been described above, the present invention provides a method for forming a functional part free from a void, gap or hollow in a minute space by using a low-temperature dispersion functional material.

The present invention will be more fully understood from the detailed description given hereinbelow and the accompanying drawings which are given by way of illustration only, and thus not to be considered as limiting the present invention.

DESCRIPTION OF THE PREFERRED EMBODIMENTS

Figure 1:
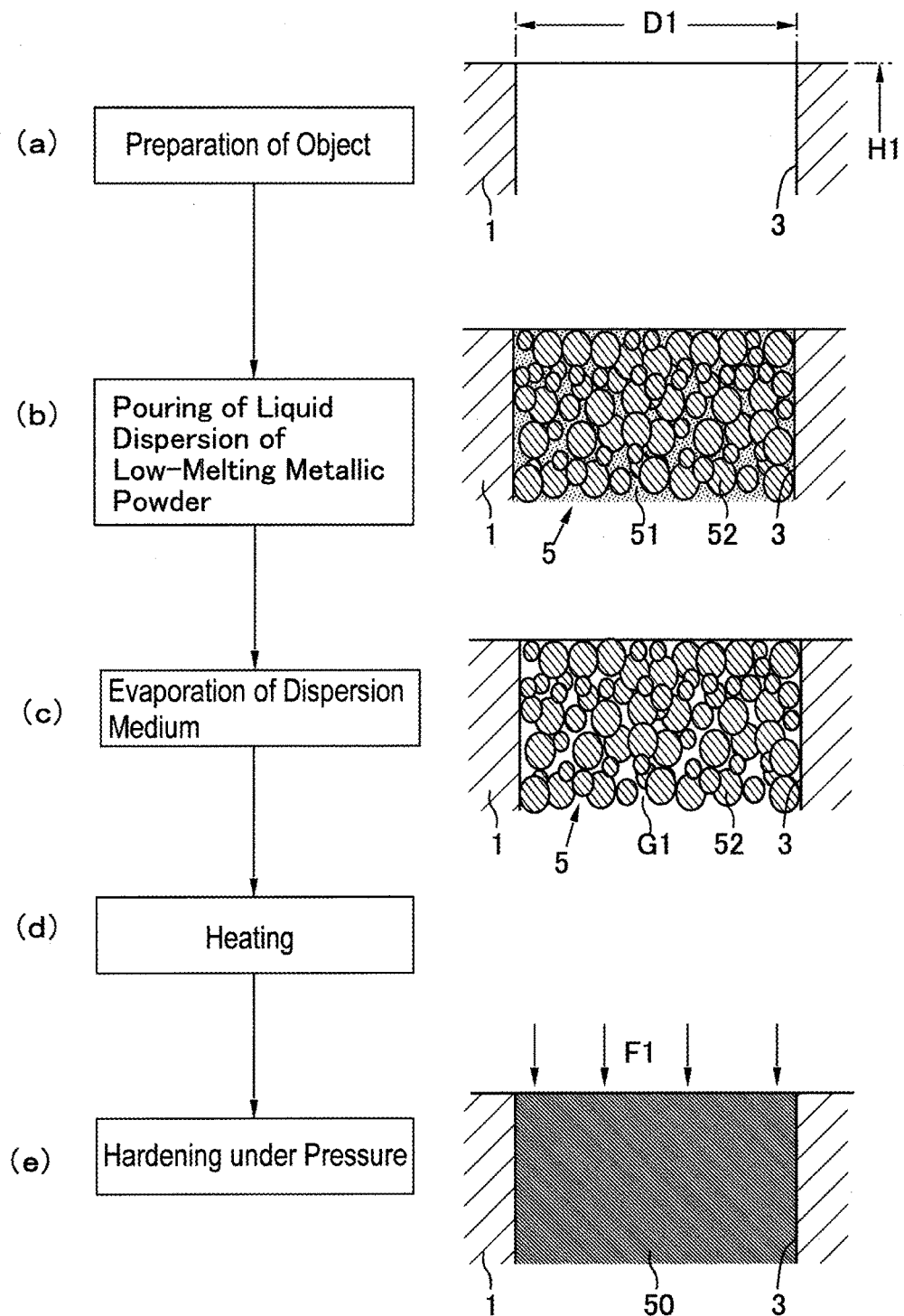
FIG. 1 is a block diagram showing a first method according to the present invention.

FIG. 1 is a drawing showing a first method. The first method relates to a specific method for forming a metallic part in a minute space 3. At first, an object 1 having the minute space 3 is prepared (FIG. 1(a)). Examples of the object include various objects having a minute space such as a wafer, a circuit substrate, a multilayer substrate, a semiconductor chip and a MEMS (micro-electro-mechanical systems). The minute space may be not only a through-hole or a non-through-hole (blind hole) represented by a TSV (through silicon via) but also a minute gap formed between stacked substrates or the like. The functional powder may have any shape such as a spherical shape, a scale shape, a flat shape, etc.

The liquid dispersion medium in which the functional powder is to be dispersed may be an aqueous dispersion medium or a volatile organic dispersion medium. Particularly preferred is a volatile organic dispersion medium that can evaporate at room temperature. Since there are known various types of such liquid dispersion media, they can be used selectively.

In the present embodiment, the minute space 3 formed in the object 1 is a through-hole or a non-through-hole having a diameter D1 at the opening and a depth H1. For example, the diameter D1 is 25 μm or less, while an aspect ratio of the depth H1 to the diameter D1 is 1 or more, preferably 5 or more. When the object 1 is a wafer, for example, a large number of the above-described minute spaces 3 are distributed over the surface of the wafer.

A dispersion functional material 5 in which a low-melting metallic powder is dispersed in the liquid dispersion medium is filled (poured) into the minute space 3 of the above-described object 1 (FIG. 1(b)). In this case, the dispersion functional material 5 is a dispersion in which a low-melting metallic powder 52 is dispersed as a thermally-meltable functional powder in a dispersion medium 51. A typical example of the low-melting metallic powder 52 is an Sn alloy powder. The Sn alloy powder preferably comprises nm-sized nanoparticles (1 μm or less) or particles having a nanocomposite structure. In addition to the Sn alloy powder, it may also contain another metallic powder, e.g., at least one of Bi, Ga and In powders. The powder may have any shape such as a spherical shape, a scale shape, a flat shape, etc. For filling, preferably adopted is the above-mentioned differential pressure filling process.

When filling the dispersion functional material 5 into the minute space 3, it is preferably performed under a reduced-pressure atmosphere within a vacuum chamber. There may be adopted a differential pressure filling process, wherein the internal pressure of the vacuum chamber is increased after the pressure reduction. With this differential pressure filling process, the dispersion functional material 5 can be reliably filled into the minute space 3.

Then, the low-melting metallic powder 52 is thermally melted within the minute space 3, while the liquid dispersion medium 51 is evaporated (FIGS. 1(c), 1(d)). Thus, a gap G1 is created between the particles of the low-melting metallic powder 52, and the gap G1 is filled up with the melted low-melting metallic powder 52. In the case where the low-melting metallic powder 52 is composed mainly of the Sn alloy powder, it can be thermally melted at its melting point (about 231° C.).

Then, the thermally-melted low-melting metallic powder 52 is hardened by cooling under pressure F1 (FIG. 1(e)). Thus, a functional part 50 of a low-melting metal can be formed within the minute space 3 of the object 1. In the above-described process, preferably, at least the steps of FIGS. 1(a) to 1(d) are performed within the vacuum chamber.

Since the dispersion functional material 5 is filled into the minute space 3, as described above, the low-melting metallic powder 52, which is inherently difficult to use for filling because of its powder form, can be reliably filled into the minute space 3 by using the fluidity of the dispersion functional material 5. For filling, there may be adopted a differential pressure filling process.

Moreover, since the dispersion functional material 5 in which the low-melting metallic powder 52 is dispersed in the liquid dispersion medium 51 is used, a melting process is not required, unlike in the related art using a molten metal. The dispersion functional material 5 at a low-temperature condition can be filled into the minute space 3 by the differential pressure filling process or the like. In the case where the object 1 having the minute space 3 is a wafer in which a semiconductor circuit has been previously formed or the like, for example, thermal adverse effects on the semiconductor circuit can be minimized. Furthermore, since heat energy is not required for melting, energy consumption can be reduced.

In the first method, after the above-described dispersion functional material 5 is filled into the minute space 3, the liquid dispersion medium 51 is evaporated while the low-melting metallic powder 52 is thermally melted within the minute space 3, and then the thermally-melted low-melting metallic powder 52 is hardened by cooling under pressure, so that the functional part 50 can be obtained, for example, as a low electrical resistance element of an Sn alloy or the like (FIG. 1(e)).

Moreover, since the thermally-melted low-melting metallic powder 52 is hardened by cooling under pressure, the applied pressure prevents the creation of a gap or void, which might otherwise be formed between the minute space 3 and the casting because of contraction in volume upon cooling, enabling the formation of a high-quality functional part 50 free from a gap or void.

Furthermore, since the thermally-melted low-melting metallic powder 52 is hardened by cooling under pressure, grain growth or crystal growth of the low-melting metal can be suppressed. This suppresses columnar crystal growth and transforms the low-melting metal into equiaxed crystals, so that the stress can be reduced to avoid problems, e.g., microcrack formation in the object 1 having the minute space 3.

Figure 2:
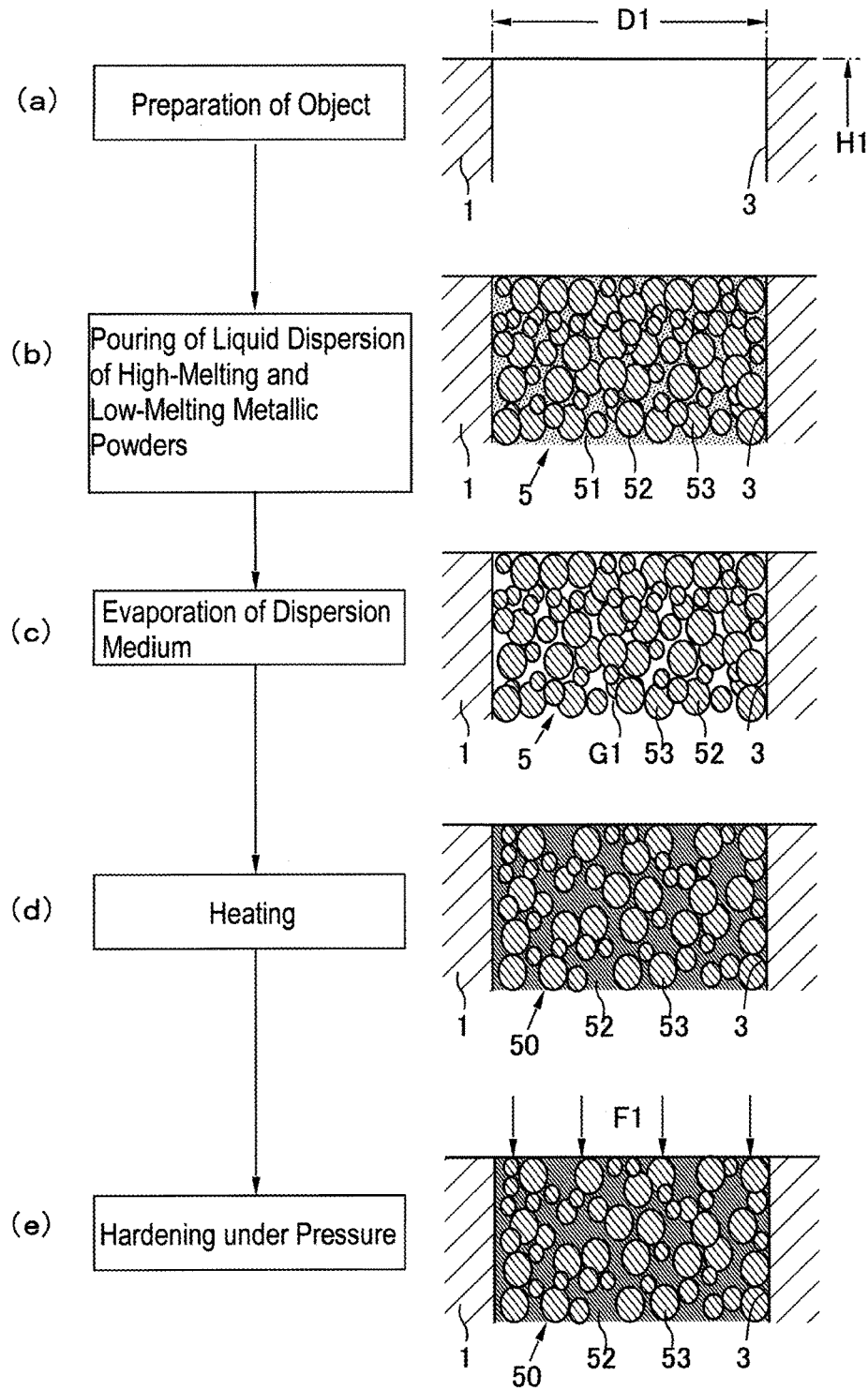
FIG. 2 is a block diagram showing a second method according to the present invention.

Next, FIG. 2 shows a second method. In this figure, the portions corresponding to the components shown in FIG. 1 are denoted by the same reference symbols. The second method shown in FIG. 2 is characterized in that a metallic part comprising a high-melting metal and a low-melting metal is formed in the minute space 3 by using high-melting and low-melting metallic powders in combination for a functional material and a binder. In the second method, at the start of the formation of the metallic part in the minute space 3, the object 1 having the minute space 3 is prepared as in the first method (FIG. 2(*a*)). Then, as shown in FIG. 2, a dispersion functional material 5 in which a low-melting metallic powder 52 and a high-melting metallic powder 53 are dispersed in the liquid dispersion medium 51 is filled into the minute space 3 by the above-mentioned differential pressure filling process (FIG. 2(*b*)). The low-melting metallic powder 52 and the high-melting metallic powder 53 may have different particle sizes or a uniform particle size.

Then, the liquid dispersion medium 51 is evaporated while the low-melting metallic powder 52 is thermally melted within the minute space 3 (FIG. 2(*c*)), and then the high-melting metallic powder 53 and the melted low-melting metallic powder 52 are hardened by cooling under pressure. During this step, the high-melting metallic particles 53 are diffusion-bonded with the melted low-melting metallic powder 52 filling up a gap G1 between the high-melting metallic particles 53, 53. In the above-described process, at least the steps of FIGS. 2(*a*) to 2(*c*) are performed within the vacuum chamber.

For the low-melting metallic powder 52, the above-described Sn alloy-based powder can be used. In addition to the Sn alloy powder, it may also contain another metallic powder, e.g., a Bi powder, a Ga powder or an In powder, as described above. The high-melting metallic powder 53 may be composed of a material containing at least one element selected from the group consisting of Ag, Cu, Au, Pt, Ti, Zn, Al, Fe, Si and Ni. Such a high-melting metallic powder 53 preferably comprises nm-sized nanoparticles (1 µm or less) or particles having a nanocomposite structure. The low-melting metallic powder 52 and the high-melting metallic powder 53 may have different particle sizes or a uniform particle size. They may also have any shape such as a spherical shape, a scale shape, a flat shape, etc.

Also in the second method, the low-melting metallic powder 52 and the high-melting metallic powder 53, which are inherently difficult to use for filling because of their powder form, can be reliably filled into the minute space 3 by using the fluidity of the dispersion functional material 5.

Moreover, since the dispersion functional material 5 in which the low-melting metallic powder 52 and the high-melting metallic powder 53 are dispersed in the liquid dispersion medium 51 is used, a melting process is not required, unlike in the related art using a molten metal. The dispersion functional material 5 at a low-temperature condition can be readily filled into the minute space 3 by using its fluidity and a means for applying at least one kind of pressure selected among a gas pressure, a pressing pressure, an injection pressure and a rolling compaction. In the case where the object 1 having the minute space 3 is a wafer in which a semiconductor circuit has been previously formed or the like, moreover, thermal adverse effects on the semiconductor circuit can be minimized. Furthermore, since heat energy is not required for melting, energy consumption can be reduced.

After the dispersion functional material 5 is filled into the minute space 3, moreover, the liquid dispersion medium 51 is evaporated while the low-melting metallic powder 52 is thermally melted within the minute space 3, and then the high-melting metallic powder 53 and the melted low-melting metallic powder 52 are hardened by cooling under pressure F1. Through the above process, there can be obtained a functional part 50 comprising a high-melting metal and a low-melting metal (FIG. 2(*e*)). Since a bonding power due to melting and solidification of the low-melting metallic powder 52 can be used for casting, no additional binder is required. Thus, the properties of the high-melting metallic powder 53 and the low-melting metallic powder 52 can be exhibited as they are.

Moreover, since the high-melting metallic powder 53 and the melted low-melting metallic powder 52 are cooled under the pressure F1, the applied pressure F1 prevents the creation of a gap or void, which might otherwise be formed between the minute space 3 and the casting because of contraction in volume upon cooling, enabling the formation of a high-quality functional part 50 free from a gap or void.

Furthermore, since the thermally-melted low-melting metallic powder 52 is cooled under pressure for molding, grain growth or crystal growth of the low-melting metal and the high-melting metal can be suppressed. This transforms the low-melting metal and the high-melting metal into equiaxed crystals, so that the stress can be reduced to avoid problems, e.g., microcrack formation in the object 1 having the minute space 3.

In the second method, the high-melting metallic particles are diffusion-bonded with the melted low-melting metallic powder 52 filling up a gap between the high-melting metallic particles of the high-melting metallic powder 53. Accordingly, the low-melting metal and the high-melting metal are integrated to constitute a casting, serving functions corresponding to the properties of these metals.

Figure 3:
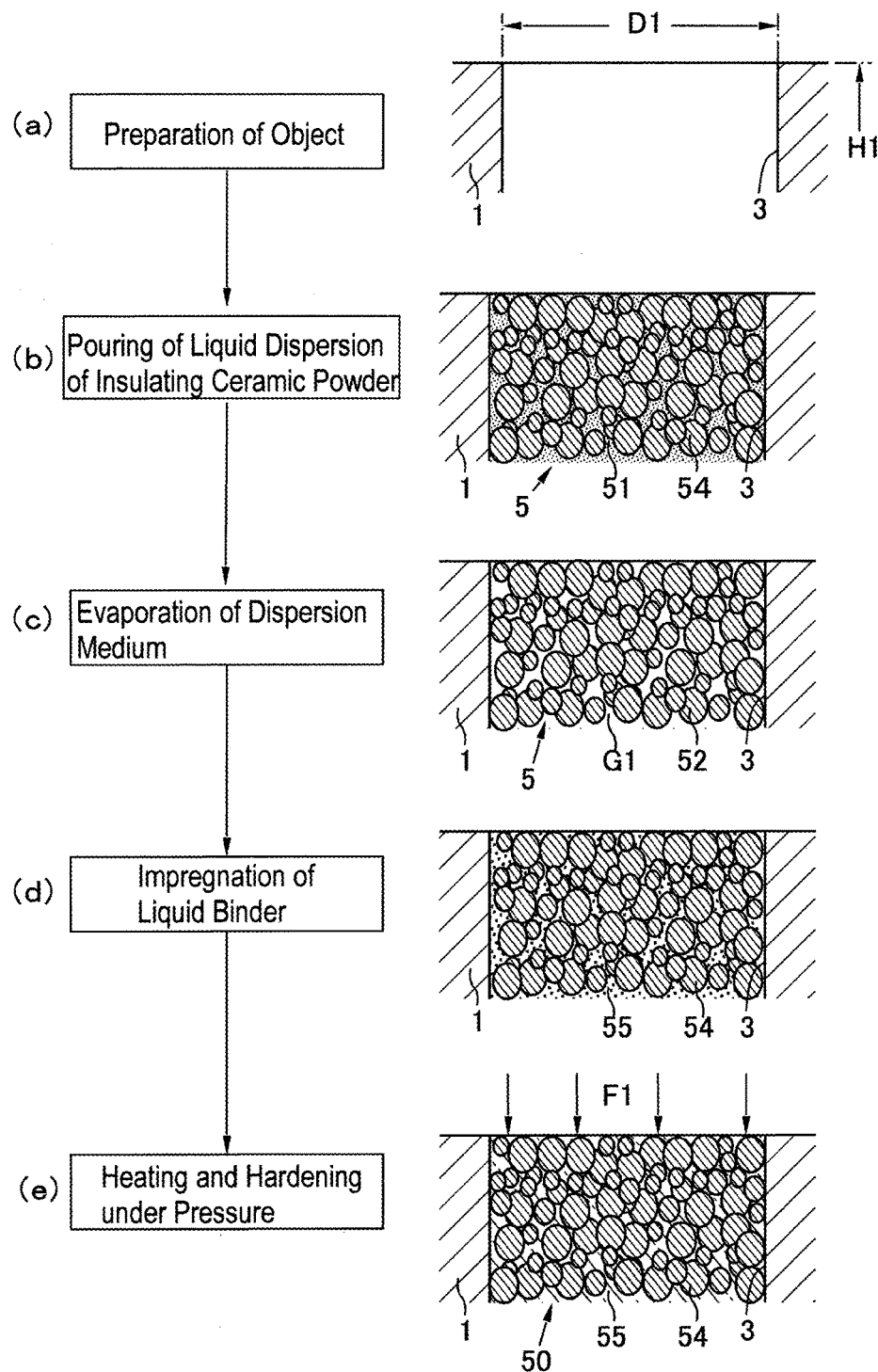
FIG. 3 is a block diagram showing a third method according to the present invention.

FIG. 3 shows a third method. In this figure, the portions corresponding to the components shown in FIG. 1 are denoted by the same reference symbols. The third method relates to a specific method for forming an electrically insulating part in the minute space 3. Referring to FIG. 3, after a dispersion functional material 5 in which an insulating ceramic powder 54 is dispersed in the liquid dispersion medium 51 is filled into the minute space 3 (FIGS. 3(*a*), 3(*b*)) at the start of the formation of the electrically insulating part, the liquid dispersion medium 51 of the dispersion functional material 5 present in the minute space 3 is evaporated (FIG. 3(*c*)), and then a liquid binder 55 is filled into a gap G1 between particles of the insulating ceramic powder 54 present in the minute space 3 (FIG. 3(*d*)). Then, the ceramic powder 54 and the liquid binder 55 are hardened under pressure such that the liquid binder 55 is chemically reacted with the insulating ceramic powder 54 by a heat treatment or the like (FIG. 3(*e*)).

Also in the third method, used is the dispersion functional material 5 in which the insulating ceramic powder 54, which is inherently difficult to use for filling because of its powder form, is dispersed in the liquid dispersion medium 51, and it can be readily filled into the minute space 3 by using its fluidity.

Through the process of evaporating the liquid dispersion medium 51 filled into the minute space 3, then filling the liquid binder 55 into the gap between the particles of the insulating ceramic powder 54 present in the minute space 3, and finally hardening the insulating ceramic powder 54 and the liquid binder 55 under pressure, moreover, there can be obtained an electrically insulating functional part 50 comprising an insulating ceramic and a binder.

Furthermore, since the insulating ceramic powder 54 and the liquid binder 55 are hardened under pressure, the applied pressure prevents the creation of a gap or void, which might otherwise be formed between the minute space 3 and the casted functional part 50, enabling the formation of a high-quality functional part 50 free from a gap or void.

The liquid binder 55 may be a liquid glass or an organic resin. The organic resin is preferably a thermosetting resin. The insulating ceramic powder 54 may contain, but not limited to, at least one component of a metal oxide such as $SiO_2$ or $Al_2O_3$ and a nitride such as SiN.

The liquid dispersion medium 51 may be an aqueous dispersion medium or a volatile organic dispersion medium, as described above. A typical example of the volatile organic dispersion medium is an alcohol having a hydroxyl group (OH). Next will be described a specific example using such a volatile organic dispersion medium 51.

In the case where an alcohol having a hydroxyl group (OH) is used as the volatile organic dispersion medium 51, since most of it evaporates under a reduced-pressure atmosphere within the vacuum chamber, the gap G1 can be formed between particles of the insulating ceramic powder 54. In addition, the OH groups of the volatile organic dispersion medium 51 adhere to the surface of the insulating ceramic powder 54 because of their bonding power to the ceramic particles, e.g., $SiO_2$. A mass of the insulating ceramic powder 54 may be pressed after the evaporation of the dispersion medium 51.

In the case where an alcohol having a hydroxyl group (OH) is used as the volatile organic dispersion medium, the liquid binder 55 may be a liquid silica or a liquid Si compound. The liquid binder 55 comprising a liquid silica or a liquid Si compound penetrates into the gap G1 between particles of the insulating ceramic powder 54. Also in this case, the process is still performed under a reduced-pressure atmosphere. The internal pressure of the vacuum chamber may be increased after the pressure reduction (according to a differential pressure filling process). With this differential pressure filling process, the liquid binder 55 can be thoroughly filled into the space around the ceramic particles.

When using the liquid silica, conversion to silica occurs with the evaporation of its organic solvent. When using the liquid Si compound, the Si compound is reacted with the OH groups adhering to the surface of the insulating ceramic powder 54 to cause conversion to silica.

Examples of the liquid Si compound include a silazane, a siloxane and a silanol. The following description will be made taking as an example the case where a polysilazane (PHPS) that is an inorganic silazane polymer is used. The polysilazane can be converted to silica through reaction with water or oxygen. The organic solvent may be a xylene, a mineral turpentine or an high-boiling aromatic solvent.

With the OH groups left on the surface of the insulating ceramic powder 54, the polysilazane is converted to silica through reaction with the OH groups. Usually, the silica thus obtained becomes amorphous.

In order to promote the conversion to silica, preferably, heating is performed under pressure by using a pressing plate or the like during the heating step. The heating temperature varies with the kind of polysilazane but can usually be set within the range from a room temperature to 450° C. During this heating treatment, a cracked gas from the organic solvent can be released.

After the above step, firing is preferably performed, for example, at around 1000° C. so as to further promote the conversion to silica and release the cracked gas.

The minute space is not limited to a through-hole or a non-through-hole. Multilayer electronic devices in which a number of substrates are stacked have an undercoat structure in which an electrically insulating material is filled into a minute gap (minute space) created between the substrates. The present invention is also applicable to formation of such an undercoat.

While the present invention has been particularly shown and described with respect to preferred embodiments thereof, it will be understood by those skilled in the art that various changes in form and detail may be made therein without departing from the spirit, scope and teaching of the invention.

What is claimed is:

1. A method for preparing a structure comprising a substrate with a functional part, comprising the steps of:
   providing a substrate having a through-hole or non-through-hole, or stacked substrates having a gap;
   filling the through-hole, the non-through-hole or the gap with a dispersion functional material consisting of:
      a liquid dispersion medium; and
      a thermally-meltable functional powder and a binder powder which are dispersed in the liquid dispersion medium;
   evaporating and removing the liquid dispersion medium present in the through-hole, the non-through-hole or the gap;
   heating the functional material to be made into a molten metal; and
   hardening the molten metal under pressure to obtain a functional part made from the molten metal in the substrate or the stacked substrates such that the through-hole, the non-through-hole or the gap is filled with the functional part.

2. The method according to claim 1, wherein the thermally-meltable functional powder is a mixture of a low-melting metallic powder and a high-melting metallic powder.

3. The method according to claim 2, wherein the high-melting metallic powder is formed in nanoparticles or particles having a nanocomposite structure.

4. The method according to claim 2, wherein the low-melting metallic powder is a metallic powder comprising Sn, which is formed in nanoparticles or particles having a nanocomposite structure.

5. The method according to claim 2, wherein the high-melting metallic powder is a metallic powder comprising at least one element selected from the group consisting of Ag, Cu, Au, Pt, Ti, Zn, Al, Fe, Si, and Ni.

6. The method according to claim 1, wherein the liquid dispersion medium is an aqueous dispersion medium or a volatile organic dispersion medium.

7. The method according to claim 1, wherein the functional part exhibits a property selected from the group consisting of electrical properties, dielectric properties, magnetic properties and optical properties.

* * * * *